(12) United States Patent
Shigihara

(10) Patent No.: US 6,285,694 B1
(45) Date of Patent: Sep. 4, 2001

(54) SEMICONDUCTOR LASER

(75) Inventor: Kimio Shigihara, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/073,760

(22) Filed: May 7, 1998

(30) Foreign Application Priority Data

Feb. 18, 1998 (JP) .................................................. 10-035732

(51) Int. Cl.$^7$ ...................................................... H01S 5/00
(52) U.S. Cl. ............................................... 372/45; 372/46
(58) Field of Search .................. 372/45, 46; 331/94.5 H; 357/1.6, 17, 18

(56) References Cited

U.S. PATENT DOCUMENTS

| | | | |
|---|---|---|---|
| 4,121,179 | * 10/1978 | Chinone | 331/94.5 H |
| 4,326,176 | * 4/1982 | Aiki | 372/45 |
| 4,630,279 | * 12/1986 | Kajimura | 372/45 |
| 4,740,976 | * 4/1988 | Kajimura | 372/45 |
| 4,862,470 | * 8/1989 | Suyama | 372/45 |
| 4,961,197 | * 10/1990 | Tananka | 372/45 |
| 5,592,502 | * 1/1997 | Matsumoto | 372/45 |
| 5,727,012 | * 3/1998 | Baillargeon | 372/75 |
| 5,963,572 | * 10/1999 | Hiroyama | 372/46 |

FOREIGN PATENT DOCUMENTS 5243669  9/1993 (JP) .

OTHER PUBLICATIONS

Hashimoto et al., "Aging Time Dependence Of Catastrophic Optical Damage (COD) Failure Of A 0.98–$\mu$m GaInAs–GaInP Strained Quantum–Well Laser", IEEE Journal of Quantum Electronics, vol. 33, No. 1, Jan. 1997, pp. 66–70.

* cited by examiner

Primary Examiner—Teresa M. Arroyo
Assistant Examiner—Gioacchino Inzirillo
(74) Attorney, Agent, or Firm—Leydig, Voit & Mayer, Ltd

(57) ABSTRACT

A semiconductor laser includes a semiconductor substrate of a first conductivity type and having a front surface; a first semiconductor layer disposed on the front surface of the semiconductor substrate and having a refractive index that increases with distance from the semiconductor substrate; an active layer disposed on the first semiconductor layer; and a second semiconductor layer disposed on the active layer, having a refractive index that decreases with distance from the active layer, and having a ridge. In this laser, the refractive index distribution between the ridge and the substrate is asymmetrical about the active layer so that the center of the intensity of light generated in the semiconductor laser distribution shifts from the active layer toward the substrate, in the direction perpendicular to the front surface of the substrate. Therefore, propagated light is hardly affected by the refractive index distribution in the width direction of the laser, caused by the presence of the ridge, so that higher oscillation is suppressed.

8 Claims, 9 Drawing Sheets

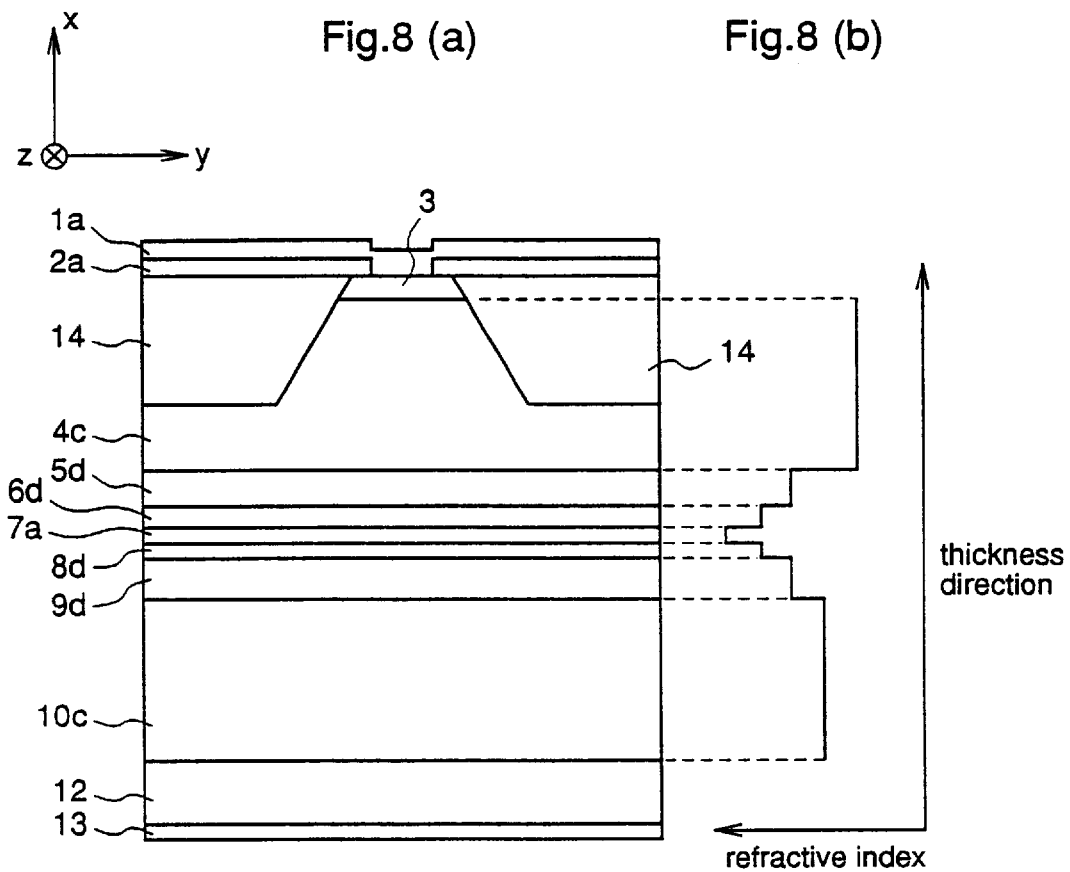

Prior Art
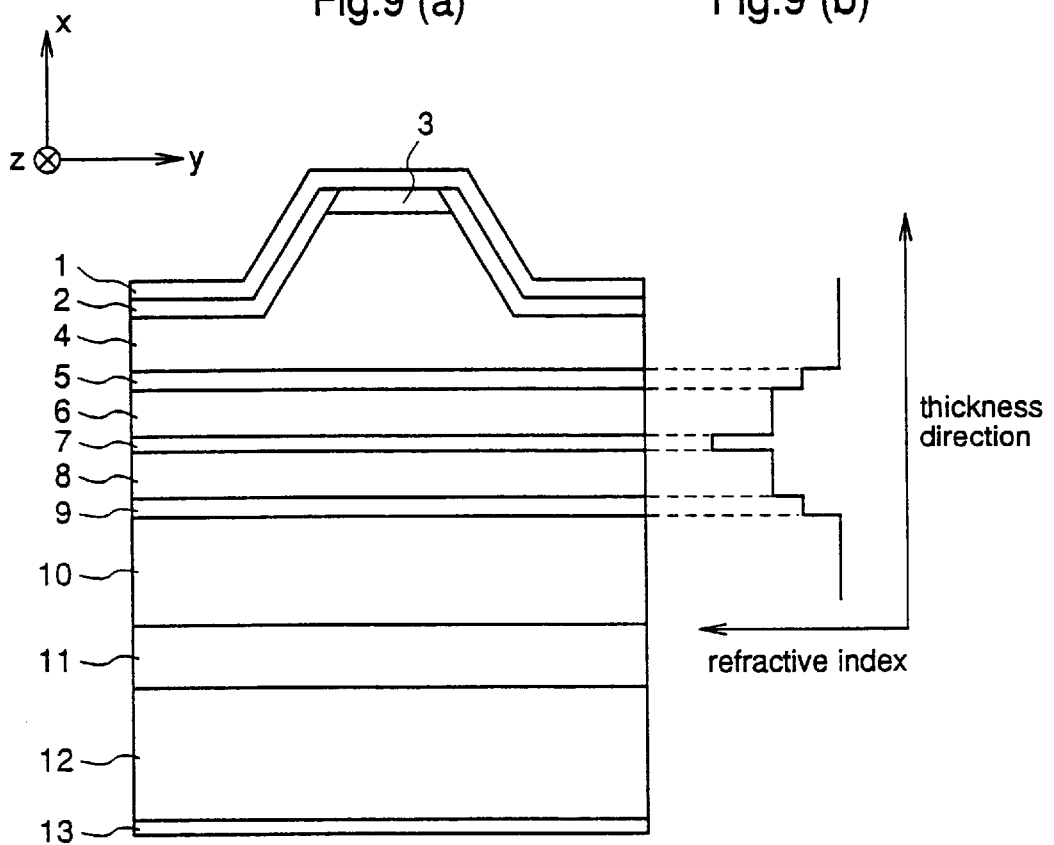

SEMICONDUCTOR LASER

FIELD OF THE INVENTION

The present invention relates to semiconductor lasers and, more particularly, to a semiconductor laser used as a light source for information processing or optical communication.

BACKGROUND OF THE INVENTION

FIG. 9(a) is a cross-sectional view of a ridge type semiconductor laser disclosed by J. Hashimoto et.al. in IEEE Journal of Quantum Electron, Vol.33, pp.66–77, 1997. This laser comprises a p side electrode 1, an insulating film 2, a p type GaAs contact layer 3, a p type GaInP upper cladding layer 4 having a stripe-shaped ridge extending in the resonator length direction, a ridge side undoped GaInAsP second guide layer 5, a ridge side undoped GaAs first guide layer 6, an active layer 7, a substrate side undoped GaAs first guide layer 8 having the same composition ratio and thickness as those of the ridge side first guide layer 6, a substrate side undoped GaInAsP second guide layer 9 having the same composition ratio and thickness as those of the ridge side second guide layer 5, an n type GaInP lower cladding layer 10 having the same composition ratio as that of the upper cladding layer 4 and the same thickness as that of the ridge of the cladding layer 4, an n type GaAs buffer layer 11, an n type GaAs substrate 12, and an n side electrode 13. FIG. 9(b) is a graph showing the refractive index profile of the semiconductor laser in the direction perpendicular to the surface of the substrate 12. In FIG. 9(a), "z" shows the resonator length direction, "x" shows the direction perpendicular to the surface of the substrate 12 (hereinafter referred to as "thickness direction"), and "y" shows the direction perpendicular to both of the resonator length direction z and the thickness direction x (hereinafter referred to as "width direction").

A description is given of the operation of the semiconductor laser. Holes and electrons are injected through the upper cladding layer 4 and the lower cladding layer 10 into the active layer 7, respectively, and recombine to generate light. The light so generated is propagated along the resonator length direction z while being influenced by the refractive indices in the thickness direction x and the width direction y, and it is amplified while being reflected between the facets of the laser, resulting in laser oscillation.

In this prior art semiconductor laser, the refractive index distribution in the thickness direction x is symmetrical about the active layer 7, until reaching the upper cladding layer 4 and the lower cladding layer 10 which are disposed on and beneath the active layer 7, respectively. That is, as shown in FIG. 9(b), the ridge side first guide layer 6, the ridge side second guide layer 5, and the upper cladding layer 4 have the same refractive indices and the same thicknesses as those of the substrate side first guide layer 8, the substrate side second guide layer 9, and the lower cladding layer 10, respectively.

As described above, in the prior art ridge type semiconductor laser, since the refractive index distribution in the thickness direction x is symmetrical about the active layer 7, the propagated light is distributed almost symmetrically about the active layer 7 in the thickness direction x. However, a refractive index present is generated in the width direction y because of the ridge of the upper cladding layer 4, when the propagated light is distributed almost symmetrically about the active layer 7 as described above, the influence of the refractive index in the width direction y on the propagated light at the ridge becomes significant, whereby a higher mode of oscillation is permitted. As a result, kinks occur due to mode competition during low-power output operation, and output power cannot be increased in the practical use.

SUMMARY OF THE INVENTION

It is an object of the present invention to provide a ridge type semiconductor laser that can shift the level at which a higher mode occurs, toward the higher power level.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a semiconductor laser including a semiconductor substrate of a first conductivity type and having a front surface; a first semiconductor layer disposed on the front surface of the semiconductor substrate and having a refractive index that increases with distance from the semiconductor substrate; an active layer disposed on the first semiconductor layer; and a second semiconductor layer disposed on the active layer, having a refractive index that decreases with distance from the active layer, and having a ridge; wherein the refractive index distribution between the ridge and the substrate is asymmetrical about the active layer so that the center of the light intensity distribution shifts from the active layer toward the substrate, in the direction perpendicular to the front surface of the substrate. Therefore, more light is distributed to the substrate side than the ridge side, and the influence of the refractive index distribution in the width direction on propagated light is reduced, which distribution occurs due to a difference in refractive indices between the ridge of the second semiconductor layer and portions of the layer outside the ridge, thereby avoiding occurrence of a higher mode that causes kinks. As a result, the light output level at which kinks occur is increased, providing a ridge type semiconductor laser capable of high-power output operation in the practical use.

According to a second aspect of the present invention, in the above-mentioned semiconductor laser, the first semiconductor layer comprises a lower cladding layer of the first conductivity type and having a refractive index, and a substrate side guide layer disposed on the lower cladding layer and having a thickness and a refractive index; the second semiconductor layer comprises a ridge side guide layer having a thickness and a refractive index, and an upper cladding layer of a second conductivity type, opposite the first conductivity type, disposed on the ridge side guide layer and having a refractive index; and at least one of the thickness and the refractive index of the substrate side guide layer is larger than that of the ridge side guide layer. Therefore, more light is distributed to the substrate side, and the light output level at which kinks occur is increased, resulting in a ridge type semiconductor laser capable of high-power output operation in the practical use.

According to a third aspect of the present invention, in the above-mentioned semiconductor laser, the refractive index of the lower cladding layer is larger than that of the upper cladding layer. Therefore, more light is distributed to the substrate side, and the light output level at which kinks occur is increased, resulting in a ridge type semiconductor laser capable of high-power output operation in the practical use. In addition, the expansion of the far field pattern is reduced, whereby the aspect ratio of light is reduced.

According to a fourth aspect of the present invention, in the above-mentioned semiconductor laser, the first semiconductor layer includes a lower cladding layer of the first conductivity type and has a thickness and a refractive index; the second semiconductor layer includes an upper cladding layer of a second conductivity type, opposite the first conductivity type, and has a thickness and a refractive index; and at least one of the thickness and the refractive index of the lower cladding layer is larger than that of the upper cladding layer. Therefore, more light is distributed to the substrate side, and the light output level at which kinks occur is increased, resulting in a ridge type semiconductor laser capable of high-power output operation in the practical use. Especially when the refractive index of the lower cladding layer is increased, the expansion of the far field pattern is reduced, whereby the aspect ratio of light is reduced.

According to a fifth aspect of the present invention, in the above-mentioned semiconductor laser, the refractive index of the lower cladding layer continuously increases toward the active layer; and the refractive index of the upper cladding layer continuously decreases with distance from the active layer. Therefore, more light is distributed to the substrate side, and the light output level at which kinks occur is increased, resulting in a ridge type semiconductor laser capable of high-power output operation in the practical use.

BRIEF DESCRIPTION OF THE DRAWINGS

FIGS. 8(a) and 8(b) are diagrams for explaining a semiconductor laser according to a sixth embodiment of the present invention.

FIGS. 9(a) and 9(b) are diagrams for explaining a semiconductor laser according to the prior art.

DETAILED DESCRIPTION OF THE PREFERRED EMBODIMENTS

[Embodiment 1]

Figure 1:
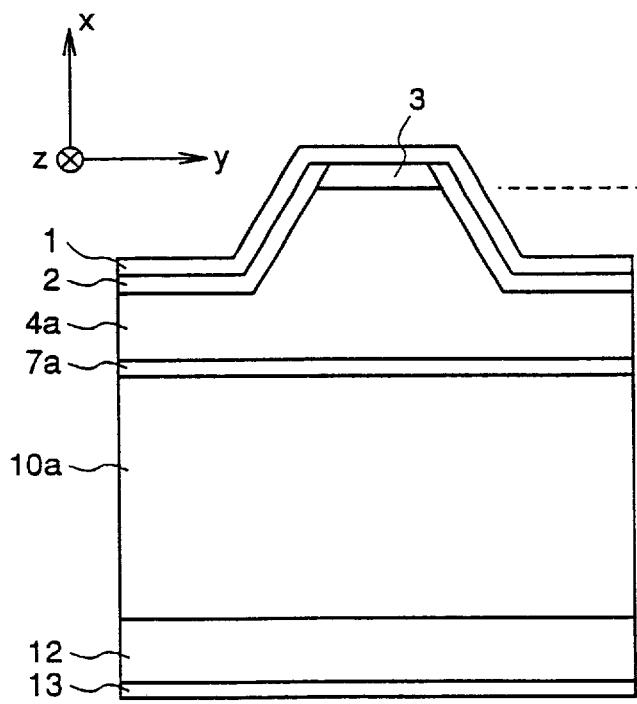
FIGS. 1(a) and 1(b) are diagrams for explaining a semiconductor laser according to a first embodiment of the present invention.
Figure 1:
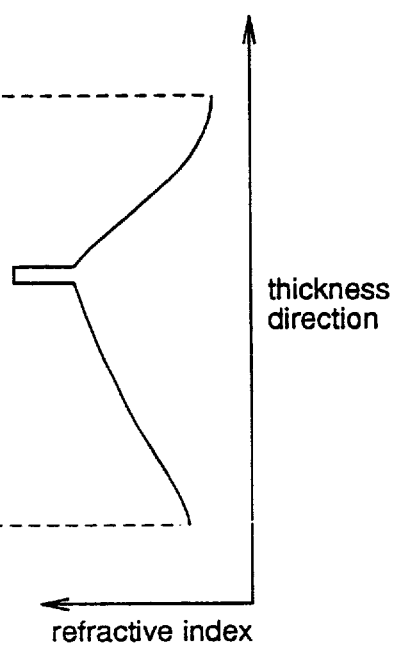

FIG. 1(a) is a cross-sectional view illustrating a semiconductor laser according to a first embodiment of the present invention, and FIG. 1(b) is a graph showing the refractive index profile of the laser in the thickness direction x. This laser includes an n type GaAs substrate 12. An n type AlGaAs lower cladding layer 10a (first semiconductor layer) is disposed on the substrate 12. An undoped InGaAs active layer 7a is disposed on the lower cladding layer 10a. A p type AlGaAs upper cladding layer 4a (second semiconductor layer) is disposed on the active layer 7a. The upper cladding layer 4a has a stripe-shaped ridge extending in the resonator length direction z, at its surface. A p type GaAs contact layer 3 is disposed on the ridge of the upper cladding layer 4a. The surface of the upper cladding layer 4a including the ridge is covered with an insulating film 2, such as a silicon oxide film, except the top of the contact layer 3. A p side electrode 1 is disposed on the insulating film 2 and on the contact layer 3. An n side electrode 13 is disposed on the rear surface of the substrate 12.

The thickness of the substrate side lower cladding layer 10a is larger than the thickness of the ridge side upper cladding layer 4a, and the refractive index of the lower cladding layer 10a at a portion contacting the substrate is larger than the refractive index of the upper cladding layer 4a at the top of the ridge. In this first embodiment, the difference in refractive indices between the lower cladding layer 10a and the upper cladding layer 4a is obtained by setting the Al composition ratio of the lower cladding layer 10a smaller than the Al composition ratio of the upper cladding layer 4a. In each of the cladding layers, the refractive index gradually decreases with distance from the active layer 7a. Thereby, the refractive index distribution between the upper cladding layer 4a and the lower cladding layer 10a in the thickness direction x is asymmetrical about the active layer 7a.

A description is given of the method of fabricating the semiconductor laser. Initially, the lower cladding layer 10a, the active layer 7a, the upper cladding layer 4a, and the contact layer 3 are successively grown on the surface of the substrate 12. The lower cladding layer 10a is grown so that the Al composition ratio continuously decreases, and the upper cladding layer 4a is grown so that the Al composition ratio continuously increases.

Next, a stripe-shaped mask comprising an insulating film (not shown) is formed on the contact layer 3 and, using this mask, the contact layer 3 and an upper portion of the upper cladding layer 4a are selectively etched to form a ridge. After removal of the mask, the insulating film 2 is formed over the surface of the structure, and a portion of the insulating film 2 at the top of the contact layer 3 is removed by etching. Further, the p side electrode 1 is formed on the insulating film 2, contacting the contact layer 3, and the n side electrode 13 is formed on the rear surface of the substrate 12. Finally, resonator facets are formed by cleaving, thereby completing the semiconductor laser shown in FIG. 1.

A description is given of the operation of the laser. Holes and electrons are injected into the active layer 7a through the ridge of the upper cladding layer 4a and the lower cladding layer 10a, respectively, and recombine to generate light. The light so generated is transmitted in the resonator length direction z while being influenced by the refractive indices in the thickness direction x and the width direction y, and it is amplified while being reflected between the facets, resulting in laser oscillation.

In the semiconductor laser according to this first embodiment, as described above, the thickness and refractive index of the lower cladding layer 10a on the substrate side are larger than those of the upper cladding layer 4a on the ridge side so that the refractive index distribution in the thickness direction x becomes asymmetrical about the active layer 7a. Since the refractive index distribution in the thickness direction x is so set, more light is distributed to the substrate side than the ridge side when viewed from the active layer 7a. Therefore, the influence of the refractive index distribution in the width direction y on the propagated light is reduced, which distribution occurs due to a difference in refractive indices between the ridge of the upper cladding layer 4a and portions of the layer 4a outside the ridge, thereby avoiding occurrence of a higher mode that causes kinks. As a result, practical high-power operation is realized. In addition, only the fundamental mode is permitted even when the ridge width is increased.

In this first embodiment of the invention, the thickness and refractive index of the lower cladding layer 10a are set larger than those of the upper cladding layer 4a to make the refractive index distribution between the lower cladding layer 10a and the upper cladding layer 4a asymmetrical about the active layer 7a. However, the present invention is not restricted thereto, and any structure may be adopted as long as the refractive index distribution becomes asymmetrical so that the center (peak) of the light intensity distribution shifts from the active layer 7a toward the substrate 12. For example, one of the thickness and the refractive index of the lower cladding layer 10a may be set larger than that of the upper cladding layer 4a to obtain the asymmetric refractive index distribution.

Furthermore, although in this first embodiment the refractive indices of the upper and lower cladding layers 4a and 10a continuously increase toward the active layer 7a, the refractive indices of the respective cladding layers may be fixed in the thickness direction x as long as the thickness and refractive index of the lower cladding layer are larger than those of the upper cladding layer.

[Embodiment 2]

Figure 2:
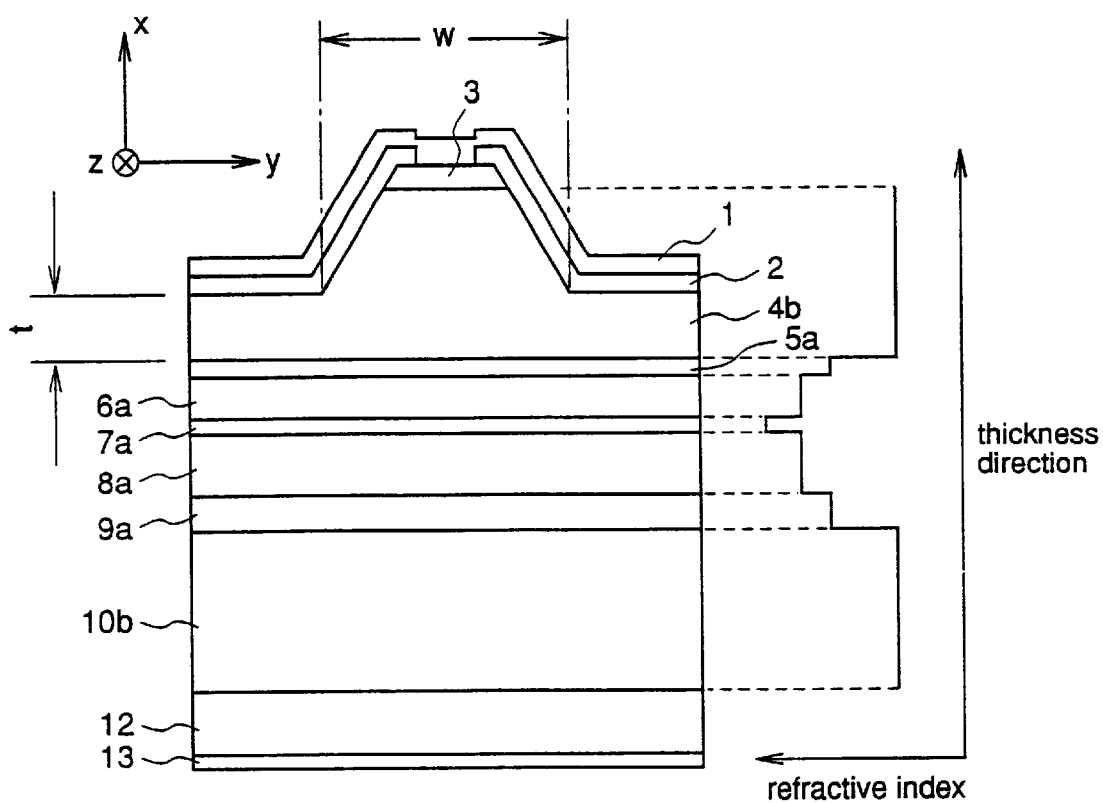
FIGS. 2(a) and 2(b) are diagrams for explaining a semiconductor laser according to a second embodiment of the present invention.

FIG. 2(a) is a cross-sectional view illustrating a semiconductor laser according to a second embodiment of the invention, and FIG. 2(b) is a graph showing the refractive index profile of the laser in the thickness direction x. The semiconductor laser according to this second embodiment is different from the semiconductor laser according to the first embodiment in the following points. While in the first embodiment the lower cladding layer 10a (first semiconductor layer) comprising a single semiconductor layer is disposed between the active layer 7a and the substrate 12, in this second embodiment a first composite semiconductor layer is disposed between the active layer 7a and the substrate 12, which composite layer comprises an n type AlGaAs lower cladding layer 10b, a substrate side second guide layer 9a comprising undoped AlGaAs and having a thickness $g_{L2}$, and a substrate side first guide layer 8a comprising undoped GaAs and having a thickness $g_{L1}$. Further, in place of the upper cladding layer 4a (second semiconductor layer) on the active layer 7a in the first embodiment, a second composite semiconductor layer is disposed on the active layer 7a in this second embodiment, which composite layer comprises a ridge side first guide layer 6a comprising undoped GaAs and having a thickness $g_{U1}$, a ridge side second guide layer 5a comprising undoped AlGaAs and having a thickness $g_{U2}$, and a p type AlGaAs upper cladding layer 4b having a ridge at its surface. The thickness $g_{L1}$ of the substrate side first guide layer 8a is larger than the thickness $g_{U1}$ of the ridge side first guide layer 6a, and the thickness $g_{L2}$ of the substrate side second guide layer 9a is larger than the thickness $g_{U2}$ of the ridge side second guide layer 5a. The lower cladding layer 10b, the substrate side first guide layer 8a, the substrate side second guide layer 9a, the ridge side first guide layer 6a, the ridge side second guide layer 5a, and the upper cladding layer 4b respectively have fixed refractive indices in the thickness direction x. The Al composition ratio of the substrate side second guide layer 9a is smaller than the Al composition ratio of the lower cladding layer 10b, and the Al composition ratio of the ridge side second guide layer 5a is larger than the Al composition of the upper cladding layer 4b. As a result, in the first composite semiconductor layer, the refractive index increases stepwise with distance from the substrate 12 and, in the second composite semiconductor layer, the refractive index decreases stepwise with distance from the active layer 7a. In FIGS. 2(a) and 2(b), the same reference numerals as those in FIGS. 1(a) and 1(b) designate the same or corresponding parts. In FIG. 2(a), W denotes the ridge width, and t denotes the thickness of a portion of the upper cladding layer at each side of the ridge, i.e., a portion outside the ridge.

The fabrication method of the semiconductor laser according to this second embodiment is identical to the fabrication method already described for the first embodiment except that the lower cladding layer 10b, the second guide layer 9a, and the first guide layer 8a are grown instead of the lower cladding layer 10a, and the first guide layer 6a, the second guide layer 5a, and the upper cladding layer 4b are grown instead of the upper cladding layer 4a.

In the semiconductor laser according to this second embodiment, as shown in FIG. 2(b), the thickness $g_{L1}$ of the substrate side first guide layer 8a and the thickness $g_{L2}$ of the substrate side second guide layer 9a are larger than the thickness $g_{U1}$ of the ridge side first guide layer 6a and the thickness $g_{U2}$ of the ridge side second guide layer 5a, respectively, so that the refractive index distribution between the upper cladding layer 4b and the lower cladding layer 10b in the thickness direction x is asymmetrical about the active layer 7a. As the result of the asymmetrical distribution of refractive index, the center of the light intensity distribution of the propagated light shifts from the active layer 7a toward the substrate, so that more light is distributed to the substrate side. Therefore, the propagated light is hardly affected by the refractive index distribution in the width direction y due to the presence of the ridge, whereby occurrence of a higher mode is suppressed.

Hereinafter, the effects provided by increasing the thicknesses of the substrate side guide layers will be described on the basis of simulation results.

Figure 3:
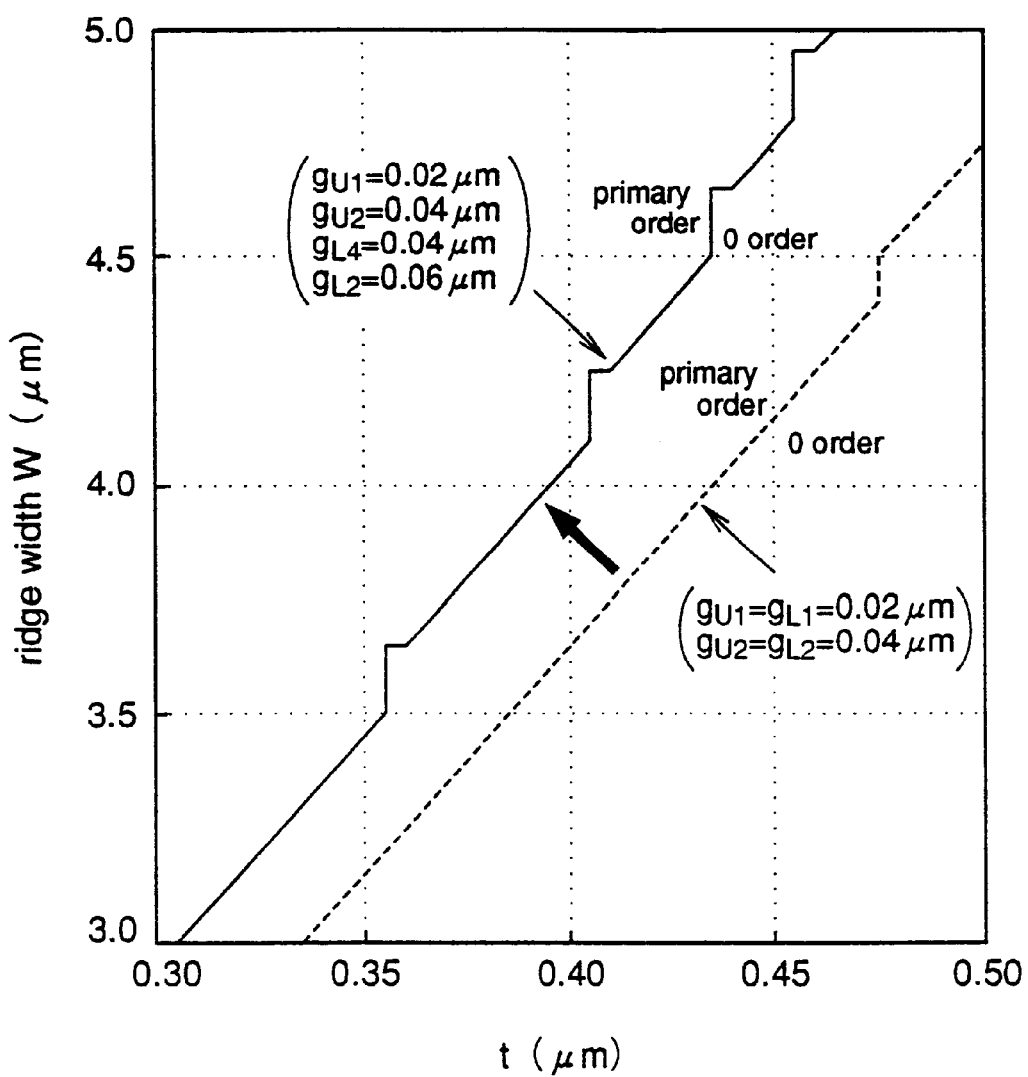
FIG. 3 is a diagram showing simulation results of the semiconductor laser according to the second embodiment.

FIG. 3 is a graph showing the simulation results of the semiconductor laser according to the second embodiment. In FIG. 3, the ordinate shows the thickness t of the upper cladding layer 4b outside the ridge, and the abscissa shows the ridge width W. Each of the continuous line and the dotted line shows the boundary between a region where only the fundamental mode (0 order) is permitted and a region where the primary mode (primary order) is also permitted, which boundary is calculated from the thickness t and the ridge width W using the equivalent refractive index method. The region where only the fundamental mode is permitted is under the boundary, and the region where the primary mode is also permitted is above the boundary. In this simulation, the Al composition ratio of the upper cladding layer 4b is 0.3, the thickness of the ridge is t+1.4 µm, and the Al composition ratio of the ridge side second guide layer 5a is 0.2. The active layer 7a has a quantum well structure in which a 20 nm thick GaAs layer is put between two 8 nm thick InGaAs layers having an In composition ratio of 0.15. The Al composition ratio of the substrate side second guide layer 9a is 0.2, and the Al composition ratio and the thickness of the lower cladding layer 10a are 0.3 and t+1.4 µm, respectively. The simulation result shown by the dotted line is obtained when the ridge side first guide layer 6a and the substrate side first guide layer 8a have the same thickness of 0.02 µm, and the ridge side second guide layer 6a and the substrate side second guide layer 9a have the same thickness of 0.04 µcm, whereby the refractive index distribution is symmetrical about the active layer 7a (symmetrical structure). The simulation result shown by the continuous line is obtained when the ridge side second guide layer 5a is 0.04 μm thick, the ridge side first guide layer 6a is 0.02 μm thick, the substrate side first guide layer 8a is 0.04 μm thick, and the substrate side second guide layer 9a is 0.06 μm thick, whereby the refractive index distribution is asymmetrical as shown in FIG. 2(b) (asymmetrical structure). It can be seen from FIG. 3 that the boundary between the fundamental mode and the primary mode shifts upward in the asymmetrical structure than in the symmetrical structure. For example, when t is 0.40 m, in the symmetrical structure, the boundary between the region where only the fundamental mode is permitted and the region where the primary mode is also permitted is present at the ridge width W of about 3.65 μm. On the other hand, in the asymmetrical structure, when t is 0.40 μm, the boundary is present at the ridge width W of about 4.05 μm. In FIG. 3, in the region between the continuous line and the dotted line, kinks easily occur as both the fundamental mode and the primary mode are permitted in this region in the symmetrical structure. However, in the asymmetrical structure according to the second embodiment, since only the fundamental mode is permitted in this region, occurrence of kinks is suppressed.

While in this second embodiment the thicknesses of both of the first and second guide layers 8a and 9a on the substrate side are increased to shift the light intensity distribution toward the substrate side, the same effects as described above are achieved even when the thickness of one of the first and second guide layers 8a and 9a is increased.

Further, while in this second embodiment two guide layers are disposed at each of the upper and lower sides of the active layer 7a, a single guide layer may be disposed at each side of the active layer 7a. Even in this case, the same effects as described above are achieved by increasing the thickness of the substrate side guide layer.

Furthermore, even when three or more guide layers are disposed at each side of the active layer 7a, the same effects as described above are achieved by increasing the thickness of at least one of the substrate side guide layers.

Moreover, while in this second embodiment the refractive indices of the respective guide layers disposed on and beneath the active layer 7a are fixed in the thickness direction, these refractive indices may be continuously increased toward the active layer 7a. Also in this case, the same effects as described above are achieved by increasing the thickness of the substrate side guide layer.

[Embodiment 3]

Figure 4:
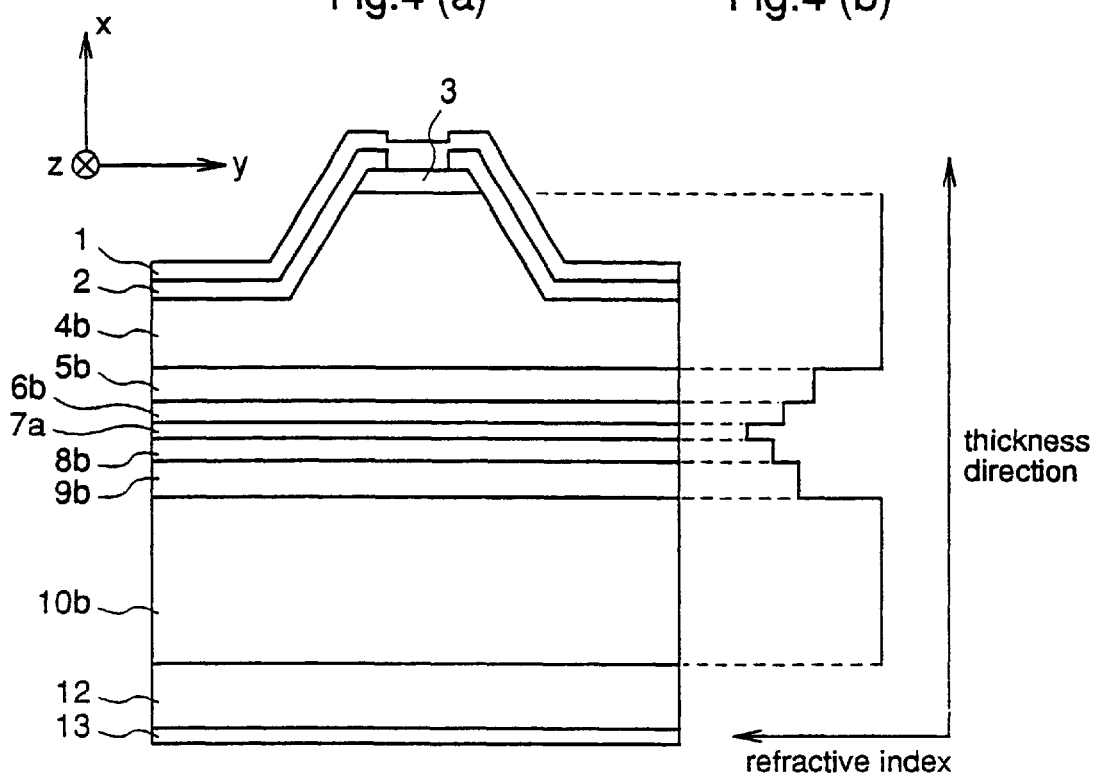
FIGS. 4(a) and 4(b) are diagrams for explaining a semiconductor laser according to a third embodiment of the present invention.

FIG. 4(a) is a cross-sectional view illustrating a semiconductor laser according to a third embodiment of the invention, and FIG. 4(b) is a graph showing the refractive index profile of the laser in the thickness direction x. The semiconductor laser according to this third embodiment is different from the semiconductor laser according to the first embodiment in the following points. While in the first embodiment the lower cladding layer 10a (first semiconductor layer) comprising a single semiconductor layer is disposed between the active layer 7a and the substrate 12, in this third embodiment a first composite semiconductor layer is disposed between the active layer 7a and the substrate 12, which composite layer comprises an n type AlGaAs lower cladding layer 10b, a substrate side second guide layer 9b comprising undoped AlGaAs and having a refractive index $n_{Lg2}$, and a substrate side first guide layer 8b comprising undoped GaAs and having a refractive index $n_{Lg1}$. Further, in place of the upper cladding layer 4a (second semiconductor layer) on the active layer 7a in the first embodiment, a second composite semiconductor layer is disposed on the active layer 7a in this third embodiment, which composite layer comprises a ridge side first guide layer 6b comprising undoped GaAs and having a refractive index $n_{Ug1}$, a ridge side second guide layer 5b comprising undoped AlGaAs and having a refractive index $n_{Ug2}$, and a p type AlGaAs upper cladding layer 4b having a ridge at its surface. The refractive index $n_{Lg1}$ of the substrate side first guide layer 8b is larger than the refractive index $n_{Ug1}$ of the ridge side first guide layer 6b, and the refractive index $n_{Lg2}$ of the substrate side second guide layer 9b is larger than the refractive index $n_{Ug2}$ of the ridge side second guide layer 5b. To set the refractive indices of these semiconductor layers as mentioned above, the Al composition ratios of the respective layers are controlled. The substrate side first guide layer 8b, the substrate side second guide layer 9b, the ridge side first guide layer 6b, and the ridge side second guide layer 5b respectively have fixed refractive indices in the thickness direction x. The Al composition ratio of the substrate side second guide layer 9b is smaller than the Al composition ratio of the lower cladding layer 10b, and the Al composition ratio of the ridge side second guide layer 5b is larger than the Al composition ratio of the upper cladding layer 4b. As a result, in the first composite semiconductor layer, the refractive index increases stepwise with distance from the substrate 12 and, in the second composite semiconductor layer, the refractive index decreases stepwise with distance from the active layer 7a. In FIGS. 4(a) and 4(b), the same reference numerals as those shown in FIGS. 1(a) and 1(b) designate the same or corresponding parts.

The fabrication method of the semiconductor laser according to this third embodiment is identical to the fabrication method already described for the first embodiment except that the lower cladding layer 10b, the substrate side the second guide layer 9b, and the substrate side first guide layer 8b are grown instead of the lower cladding layer 10a, and the ridge side first guide layer 6b, the ridge side second guide layer 5b, and the upper cladding layer 4b are grown instead of the upper cladding layer 4a.

In the semiconductor laser according to this third embodiment, as shown in FIG. 4(b), the refractive index $n_{Lg1}$ of the substrate side first guide layer 8b and the refractive index $n_{Lg2}$ of the substrate side second guide layer 9b are larger than the refractive index $n_{Ug1}$ of the ridge side first guide layer 6b and the refractive index $n_{Ug2}$ of the ridge side second guide layer 5b, respectively, so that the refractive index distribution between the upper cladding layer 4b and the lower cladding layer 10b in the thickness direction x is asymmetrical about the active layer 7a. As the result of the asymmetrical distribution of refractive index, the light intensity distribution of the propagated light shifts toward the substrate with respect to the active layer 7a, and more light is distributed to the substrate side. Therefore, the light is hardly affected by the refractive index distribution in the width direction y which is caused by the presence of the ridge, whereby occurrence of a higher mode is suppressed.

While in this third embodiment the refractive indices of both of the substrate side first and second guide layers 8b and 9b are increased, the same effects as described above are achieved even when either of these refractive indices is increased.

Further, even when a single guide layer is disposed at each of the upper and lower sides of the active layer 7a, the same effects as described above are achieved by increasing the refractive index of the substrate side guide layer.

Furthermore, even when three or more guide layers are disposed at each of the upper and lower sides of the active layer 7a, the same effects as described above are achieved by increasing the refractive index of at least one of the substrate side (lower side) guide layers.

Moreover, while in this third embodiment the refractive indices of the respective guide layers disposed on and beneath the active layer 7a are fixed in the thickness direction, these refractive indices may be continuously increased toward the active layer 7a. Also in this case, the same effects as described above are achieved by increasing the refractive indices of the substrate side guide layers as a whole.

[Embodiment 4]

Figure 5:
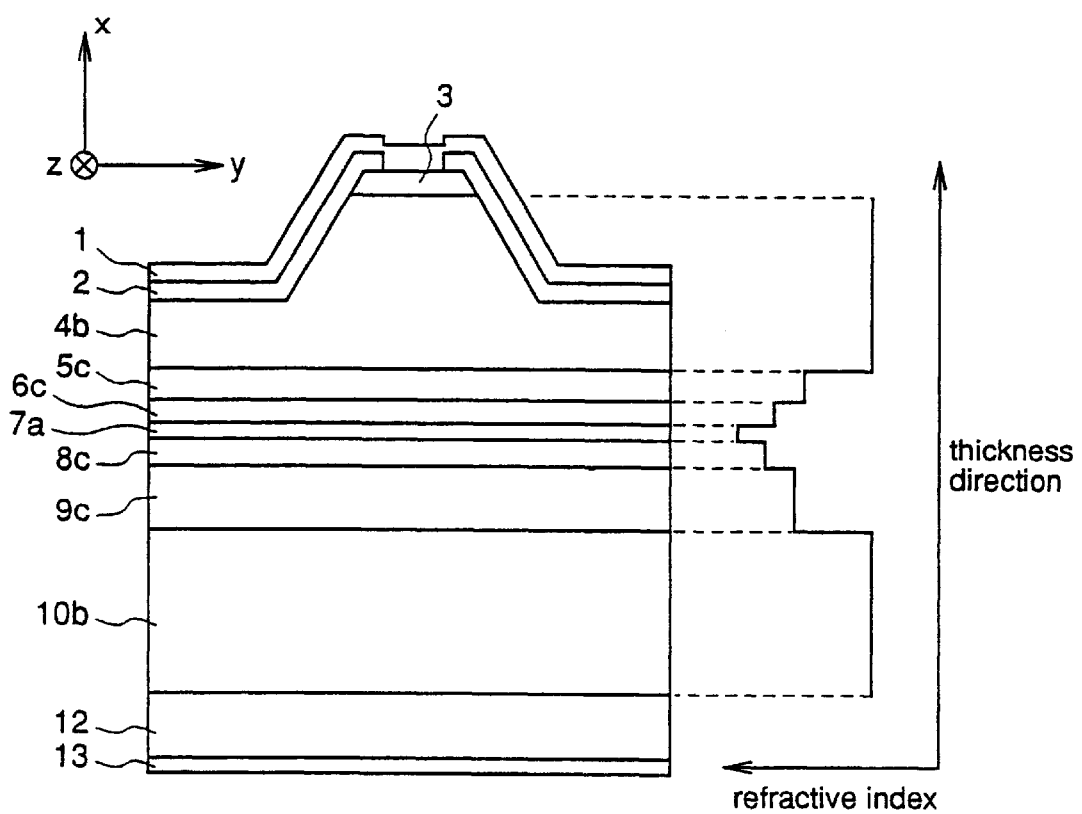
FIGS. 5(a) and 5(b) are diagrams for explaining a semiconductor laser according to a fourth embodiment of the present invention.

FIG. 5(a) is a cross-sectional view illustrating a semiconductor laser according to a fourth embodiment of the invention, and FIG. 5(b) is a graph showing the refractive index profile of the laser in the thickness direction x.

The semiconductor laser according to this fourth embodiment is different from the semiconductor laser according to the first embodiment in the following points. While in the first embodiment the lower cladding layer 10a (first semiconductor layer) comprising a single semiconductor layer is disposed between the active layer 7a and the substrate 12, in this fourth embodiment a first composite semiconductor layer is disposed between the active layer 7a and the substrate 12, which composite layer comprises an n type AlGaAs lower cladding layer 10b, a substrate side second guide layer 9c comprising undoped AlGaAs and having a thickness $g_{L2}$ and a refractive index $n_{Lg2}$, and a substrate side first guide layer 8c comprising undoped GaAs and having a thickness $g_{L1}$ and a refractive index $n_{Lg1}$. Further, in place of the upper cladding layer 4a (second semiconductor layer) on the active layer 7a in the first embodiment, a second composite semiconductor layer is disposed on the active layer 7a in this third embodiment, which composite layer comprises a ridge side first guide layer 6c comprising undoped GaAs and having a thickness $g_{U1}$ and a refractive index $n_{Ug2}$, a ridge side second guide layer 5c comprising undoped AlGaAs and having a thickness $g_{U2}$ and a refractive index $n_{U2}$, and a p type AlGaAs upper cladding layer 4b having a ridge at its surface. The thickness $g_{L1}$ of the substrate side first guide layer 8c is larger than the thickness $g_{U1}$ of the ridge side first guide layer 6c, and the thickness $g_{L2}$ of the substrate side second guide layer 9c is larger than the thickness $g_{U2}$ of the ridge side second guide layer 5c. The refractive index $n_{Lg1}$ of the substrate side first guide layer 8c is larger than the refractive index $n_{Ug1}$ of the ridge side first guide layer 6c, and the refractive index $n_{Lg2}$ of the substrate side second guide layer 9c is larger than the refractive index $n_{Ug2}$ of the ridge side second guide layer 5c. The substrate side first guide layer 8c, the substrate side second guide layer 9c, the ridge side first guide layer 6c, and the ridge side second guide layer 5c respectively have fixed refractive indices in the thickness direction x. The Al composition ratio of the substrate side second guide layer 9c is smaller than the Al composition ratio of the lower cladding layer 10b, and the Al composition ratio of the ridge side second guide layer 5c is larger than the Al composition ratio of the upper cladding layer 4b. As a result, in the first composite semiconductor layer, the refractive index increases stepwise with distance from the substrate 12 and, in the second composite semiconductor layer, the refractive index decreases stepwise with distance from the active layer 7a. In FIGS. 5(a) and 5(b), the same reference numerals as those shown in FIGS. 1(a) and 1(b) designate the same or corresponding parts.

The fabrication method of the semiconductor laser according to this fourth embodiment is identical to the fabrication method already described for the first embodiment except that the lower cladding layer 10b, the substrate side the second guide layer 9c, and the substrate side first guide layer 8c are successively grown instead of the lower cladding layer 10a, and the ridge side first guide layer 6c, the ridge side second guide layer 5c, and the upper cladding layer 4b are grown instead of the upper cladding layer 4a.

In this semiconductor laser, as shown in FIG. 5(b), the thickness $g_{L1}$ of the substrate side first guide layer 8c and the thickness $g_{L2}$ of the substrate side second guide layer 9c are larger than the thickness $g_{U1}$ of the ridge side first guide layer 6c and the thickness $g_{U2}$ of the ridge side second guide layer 5c, respectively, and the refractive index $n_{Lg1}$ of the substrate side first guide layer 8c and the refractive index $n_{Lg2}$ of the substrate side second guide layer 9c are larger than the refractive index $n_{Ug1}$ of the ridge side first guide layer 6c and the refractive index $n_{Ug2}$ of the ridge side second guide layer 5c, respectively, whereby the refractive index distribution between the upper cladding layer 4b and the lower cladding layer 10b in the thickness direction x is asymmetrical about the active layer 7a. Thereby, the center of the light intensity distribution of propagated light shifts from the active layer 7a toward the substrate 12, so that more light is distributed to the substrate side than the ridge side. As a result, the propagated light is hardly affected by the refractive index distribution in the width direction y due to the presence of the ridge, and the same effects as provided by the first embodiment are achieved.

In this fourth embodiment of the invention, the thicknesses and refractive indices of the substrate side first and second guide layers 8c and 9c are set larger than those of the ridge side first and second guide layers 6c and 5c, respectively. However, the thickness and refractive index of either of the substrate side first and second guide layers 8c and 9c may be larger than those of the ridge side guide layer, with the same effects as described above.

Further, even when a single guide layer is disposed at each of the upper and lower sides of the active layer 7a, the same effects as described above are obtained by setting the thickness and refractive index of the substrate side guide layer larger than those of the ridge side guide layer.

Furthermore, even when three or more guide layers are disposed at each of the upper and lower sides of the active layer 7, the same effects as mentioned above are obtained by setting the thickness and refractive index of at least one of the guide layers on the substrate side (lower side) larger than those of the ridge side (upper side) guide layer.

Moreover, although in this fourth embodiment the refractive indices of the respective guide layers disposed on and beneath the active layer 7a are fixed in the thickness direction x, these refractive indices may be continuously increased toward the active layer 7a. Also in this case, the same effects as described above are obtained when the refractive indices and thicknesses of the substrate side guide layers are larger than those of the ridge side guide layers.

[Embodiment 5]

Figure 6:
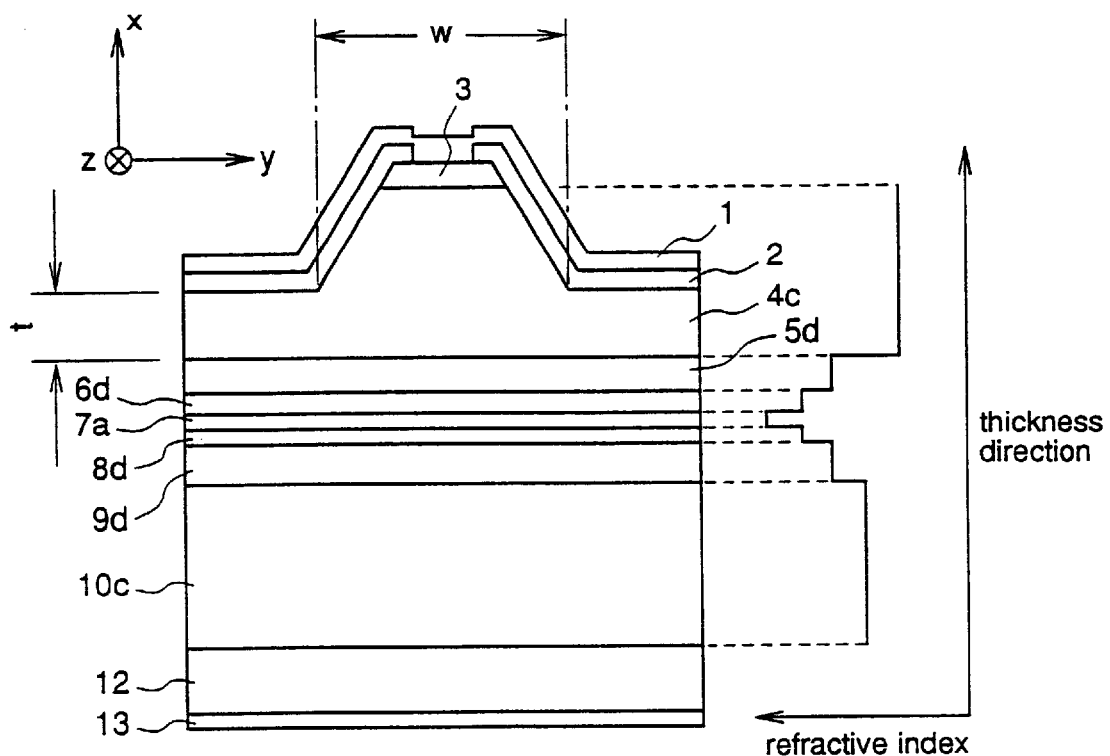
FIGS. 6(a) and 6(b) are diagrams for explaining a semiconductor laser according to a fifth embodiment of the present invention.

FIG. 6(a) is a cross-sectional view of a semiconductor laser according to a fifth embodiment of the present invention, and FIG. 6(b) is a graph showing the refractive index profile of the laser in the thickness direction x.

The semiconductor laser according to this fifth embodiment is different from the semiconductor laser according to the first embodiment in the following points. While in the first embodiment the lower cladding layer 10a (first semiconductor layer) comprising a single semiconductor layer is disposed between the active layer 7a and the substrate 12, in this fifth embodiment a first composite semiconductor layer is disposed between the active layer 7a and the substrate 12, which composite layer comprises an n type AlGaAs lower cladding layer 10c having a refractive index $n_{Lc}$, a substrate side second guide layer 9d comprising undoped AlGaAs and having a thickness $g_{L2}$ and a refractive index $n_{Lg2}$, and a substrate side first guide layer 8d comprising undoped GaAs and having a thickness $g_{L1}$ and a refractive index $n_{Lg1}$. Further, in place of the upper cladding layer 4a (second semiconductor layer) on the active layer 7a in the first embodiment, a second composite semiconductor layer is disposed on the active layer 7a in this fifth embodiment, which composite layer comprises a ridge side first guide layer 6d comprising undoped GaAs and having the same refractive index and thickness as those of the substrate side first guide layer 8d, a ridge side second guide layer 5d comprising undoped AlGaAs and having the same thickness and refractive index as those of the substrate side second guide layer 9d, and a p type AlGaAs upper cladding layer 4c having a refractive index $n_{Uc}$ and a ridge at its surface. In this fifth embodiment, the Al composition ratios of the lower cladding layer 10c and the upper cladding layer 4c are different from each other so that the refractive index $n_{LC}$ of the lower cladding layer 10c is larger than the refractive index $n_{Uc}$ of the upper cladding layer 4c. The lower cladding layer 10c, the substrate side second guide layer 9d, the substrate side first guide layer 8d, the ridge side first guide layer 6d, the ridge side second guide layer 5d, and the upper cladding layer 4c respectively have fixed refractive indices in the thickness direction x. The Al composition ratio of the substrate side second guide layer 9d is smaller than the Al composition ratio of the lower cladding layer 10c. As a result, in the first composite semiconductor layer, the refractive index increases stepwise with distance from the substrate 12 and, in the second composite semiconductor layer, the refractive index decreases stepwise with distance from the active layer 7a. In FIGS. 6(a) and 6(b), the same reference numerals as those shown in FIGS. 1(a) and 1(b) designate the same or corresponding parts.

The fabrication method of the semiconductor laser according to this fifth embodiment is identical to the fabrication method already described for the first embodiment except that the lower cladding layer 10c, the substrate side the second guide layer 9d, and the substrate side first guide layer 8d are successively grown instead of the lower cladding layer 10a, and the ridge side first guide layer 6d, the ridge side second guide layer 5d, and the upper cladding layer 4c are successively grown instead of the upper cladding layer 4a.

In this semiconductor laser, since the refractive index of the lower cladding layer 10c is larger than the refractive index of the upper cladding layer 4c as shown in FIG. 6(c), the refractive index distribution between the upper cladding layer 4c and the lower cladding layer 10c in the thickness direction x is asymmetrical about the active layer 7a. Thereby, the center of the light intensity distribution of the propagated light shifts from the active layer 7a toward the substrate 12, so that more light is distributed to the substrate side than the ridge side. As a result, the propagated light is hardly affected by the refractive index distribution in the width direction y due to the presence of the ridge, and the same effects as provided by the first embodiment are achieved. Further, in this fifth embodiment, since more light is distributed to the lower cladding layer 10c, the waveguide pattern of light itself is extended, so that the far field pattern (FFP) in the thickness direction x is narrowed. As a result, the aspect ratio, i.e., the ratio of the thickness direction FFP to the width direction FFP, is reduced.

Next, the effects provided by increasing the refractive index of the substrate side lower cladding layer 10c will be described on the basis of simulation results.

Figure 7:
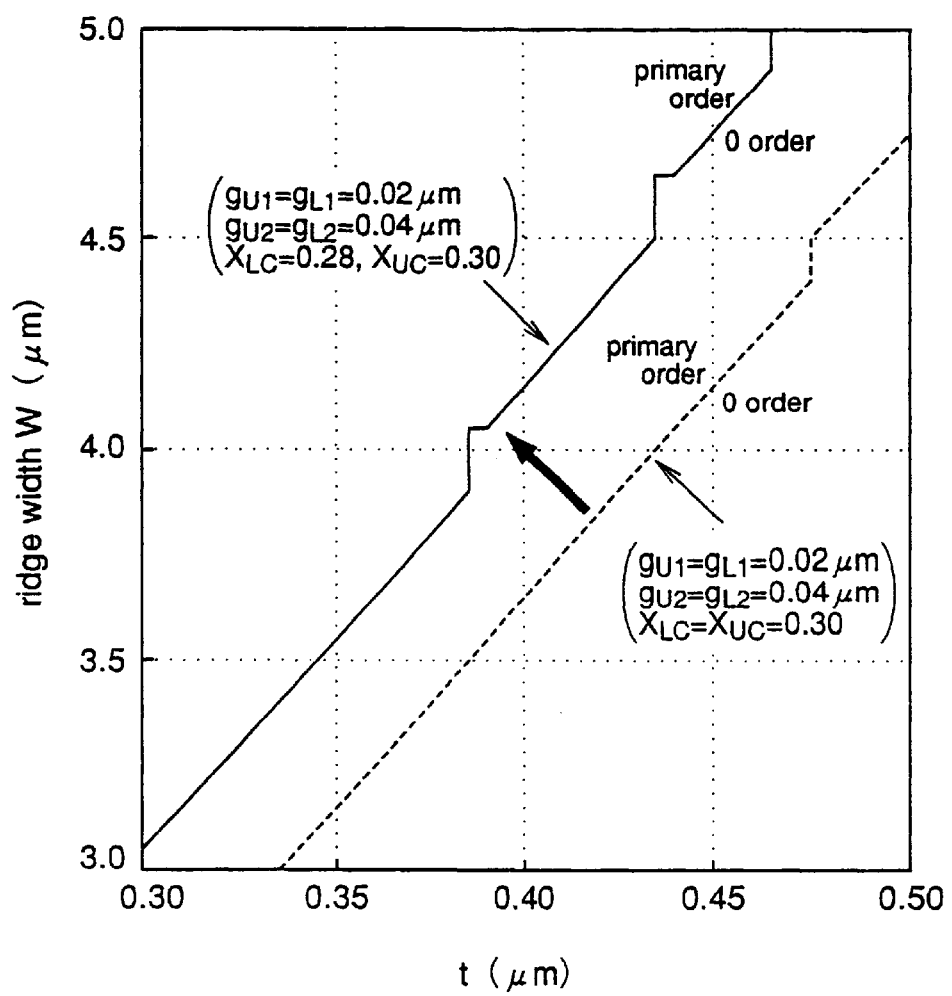
FIG. 7 is a diagram showing simulation results of the semiconductor laser according to the fifth embodiment.

FIG. 7 is a graph showing the simulation results of the semiconductor laser according to this fifth embodiment. In FIG. 7, the ordinate shows the thickness t of the upper cladding layer 4c outside the ridge, and the abscissa shows the ridge width W. Each of the continuous line and the dotted line shows the boundary between a region where only the fundamental mode (0 order) is permitted and a region where the primary mode (primary order) is also permitted, which boundary is calculated from the thickness t and the ridge width W using the equivalent refractive index method. The region where only the fundamental mode is permitted is under the boundary, and the region where the primary mode is also permitted is above the boundary. In this simulation, the Al composition ratio of the upper cladding layer 4c is 0.3, the thickness of the upper cladding layer 4c at the ridge is t+1.4 μm, and the Al composition ratio of the ridge side second guide layer 5a is 0.2. The active layer 7a has a quantum well structure in which a 20 μm thick GaAs layer is put between two InGaAs layers each having an In composition ratio of 0.15 and a thickness of 8 μm. The Al composition ratio of the substrate side second guide layer 9d is 0.2, the Al composition ratio of the lower cladding layer 10c is 0.3 or 0.28, and the thickness of the lower cladding layer 10c is t+1.4 μm. The simulation result shown by the dotted line is obtained when the refractive index distribution is symmetrical about the active layer 7a, i.e., when the Al composition ratio of the upper cladding layer 4c is equal to that of the lower cladding layer 10c and, therefore, these cladding layers have the same refractive index ($n_{LC}=n_{UC}$) The simulation result shown by the continuous line is obtained when the refractive index distribution is asymmetrical about the active layer 7a, i.e., when the Al composition ratio of the lower cladding layer 10c is smaller than that of the upper cladding layer 4c and, therefore, the refractive index of the lower cladding layer 10c is larger than that of the upper cladding layer 4c ($n_{LC}>n_{UC}$)

It can be seen from FIG. 7 that, when the refractive indices of the upper and lower cladding layers are asymmetrical, the boundary between the fundamental mode and the primary mode shifts upward than when the refractive indices of the upper and lower cladding layers are symmetrical. For example, when t=0.40 μm, the boundary is positioned at the ridge width W of about 3.5 μm in the symmetrical structure, while the boundary is positioned at the ridge width W of about 4.15 μm in the asymmetrical structure. Therefore, the same effects as provided by the second embodiment are achieved.

In this fifth embodiment, only the refractive index of the lower cladding layer 10c is set larger than the refractive index of the upper cladding layer 4c to make the refractive index distribution asymmetrical about the active layer 7a. However, in addition to the asymmetrical refractive indices of the upper and lower cladding layers, the refractive indices and thicknesses of the substrate side first and second guide layers may be set larger than those of the ridge side upper and lower guide layers as described for the fourth embodiment of the invention.

[Embodiment 6]

FIG. 8(a) is a cross-sectional view of a semiconductor laser according to a sixth embodiment of the present invention, and FIG. 8(b) is a graph showing the refractive index profile of the laser in the thickness direction x.

The semiconductor laser according to this sixth embodiment is identical to the semiconductor laser according to the fifth embodiment except that n type GaAs current blocking layers 14 are disposed on the upper cladding layer 4c, contacting both sides of the ridge of the cladding layer 4c, thereby to realize a gain waveguide type buried ridge semiconductor laser. Further, insulating films 2a are disposed on the current blocking layers 14 and on the contact layer 3 except a portion of the top of the contact layer 3, and a p side electrode 1a is disposed contacting the contact layer 3 at the top. This semiconductor laser is fabricated as follows. That is, in the fabrication process of the semiconductor laser according to the fifth embodiment, after the ridge is formed by selective etching with an insulating film as a mask, the current blocking layers 14 are selectively grown using the mask.

The buried ridge type semiconductor laser according to this sixth embodiment provides the same effects as provided by the fifth embodiment of the invention.

In this sixth embodiment, emphasis has been placed on a buried ridge type semiconductor laser obtained by burying the ridge structure of the semiconductor laser according to the fifth embodiment with the current blocking layers 14. However, a buried ridge type semiconductor laser obtained by burying the ridge structure of the semiconductor laser according to any of the first to fourth embodiments with the current blocking layers 14 is also within the scope of the invention.

Furthermore, although in this sixth embodiment the current blocking layers 14 comprise n type GaAs, current blocking layers comprising other materials may be adopted with the same effects as described above. For example, n type AlGaAs current blocking layers having an Al composition ratio higher than that of the upper cladding layer may be adopted to provide a refractive index waveguide type semiconductor laser.

In the first to sixth embodiments of the invention, the refractive index distribution viewed from the active layer is made asymmetrical by changing the thickness or the refractive index of at least one of the lower cladding layer, the substrate side first and second guide layers, the ridge side first and second guide layers, and the upper cladding layer, which are constituents of the first semiconductor laser between the active layer and the substrate and the second semiconductor layer disposed on the active layer and having a ridge at its surface. However, in the present invention, the same effects as those provided by the first to sixth embodiments are achieved as long as the refractive indices of the first semiconductor layer and the second semiconductor layer are respectively fixed in the thickness direction or are gradually decreased with distance from the active layer, and the refractive index distribution in the thickness direction is asymmetrical about the active layer so that the center of the light intensity distribution shifts from the active layer toward the substrate.

While a refractive index waveguide type semiconductor laser is described in the first to fifth embodiment and a gain waveguide type semiconductor laser is described in the sixth embodiment, the same effects are achieved in the present invention regardless of the type of the semiconductor laser.

Furthermore, while in the first to sixth embodiments of the invention AlGaAs is employed as the material of the lower cladding layer, the substrate side first and second guide layers, the ridge side first and second guide layers, and the upper cladding layer, other materials may be employed with the same effects as provided by these embodiments.

Moreover, while in the first to sixth embodiments GaAs is employed as the material of the substrate, other materials may be employed with the same effects as provided by these embodiments.

What is claimed is:

1. A semiconductor laser including:
   a semiconductor substrate of a first conductivity type and having a front surface;
   a first semiconductor layer disposed on the front surface of said semiconductor substrate;
   an active layer disposed on said first semiconductor layer, wherein said first semiconductor layer has a refractive index that increases with distance, along a thickness direction of said active layer, from said semiconductor substrate to said active layer, said first semiconductor layer comprising a lower cladding layer of the first conductivity type and having a refractive index, and a substrate side guide layer disposed between said lower cladding layer and said active layer, and having a thickness and a refractive index; and
   a second semiconductor layer disposed on said active layer and having a ridge, said second semiconductor layer having a refractive index that decreases in the thickness direction with distance from said active layer to said ridge, said second semiconductor layer comprising a ridge side guide layer having a thickness and a refractive index, and an upper cladding layer of a second conductivity type, opposite the first conductivity type, and having a refractive index, said ridge side guide layer being disposed between said active layer and said upper cladding layer, wherein at least one of the thickness and the refractive index of said substrate side guide layer is larger than the thickness and refractive index, respectively, of said ridge side guide layer so that the refractive index distribution from said ridge to said substrate is asymmetrical with respect to said active layer and light generated in said semiconductor laser has an intensity distribution between said ridge and said semiconductor substrate that has a center shifted from said active layer toward said semiconductor substrate along the thickness direction.

2. The semiconductor laser of claim 1 wherein the refractive index of said lower cladding layer is larger than the refractive index of said upper cladding layer.

3. The semiconductor laser of claim 1 wherein:
   the refractive index of said first semiconductor layer monotonically increases with distance in the thickness direction from said semiconductor substrate toward said active layer; and
   the refractive index of said second semiconductor layer monotonically decreases with distance in the thickness direction toward said ridge from said active layer.

4. The semiconductor laser of claim 1 comprising a current blocking layer disposed on said second semiconductor layer at opposite sides of and contacting said ridge, said current blocking layer having a refractive index smaller than the refractive index of said second semiconductor layer, thereby defining a refractive index waveguiding structure transverse to the thickness direction.

5. A semiconductor laser including:
   a semiconductor substrate of a first conductivity type and having a front surface;
   a first semiconductor layer disposed on the front surface of said semiconductor substrate and including a lower cladding layer of the first conductivity type, having a thickness and a refractive index;
   an active layer disposed on said first semiconductor layer, wherein said first semiconductor layer has a refractive index that increases with distance, along a thickness direction of said active layer, from said semiconductor substrate to said active layer; and a second semiconductor layer disposed on said active layer and having a ridge, said second semiconductor layer including an upper cladding layer of a second conductivity type, opposite the first conductivity type, and having a thickness and a refractive index that decreases in the thickness direction with distance from said active layer to said ridge, wherein at least one of the thickness and the refractive index of said lower cladding layer is larger than the thickness and the refractive index, respectively, of said upper cladding layer so that the refractive index distribution from said ridge to said substrate is asymmetrical with respect to said active layer and light generated in said semiconductor laser has an intensity distribution between said ridge and said semiconductor substrate that has a center shifted from said active layer toward said semiconductor substrate, along the thickness direction.

6. The semiconductor laser of claim 5 wherein:

the refractive index of said lower cladding layer continuously increases in the thickness direction toward said active layer; and the refractive index of said upper cladding layer continuously decreases in the thickness direction with distance from said active layer.

7. The semiconductor laser of claim 5 wherein:

the refractive index of said first semiconductor layer monotonically increases with distance in the thickness direction from said semiconductor substrate toward said active layer; and the refractive index of said second semiconductor layer monotonically decreases with distance in the thickness direction toward said ridge from said active layer.

8. The semiconductor laser of claim 5 comprising a current blocking layer disposed on said second semiconductor layer at opposite sides of and contacting said ridge, said current blocking layer having a refractive index smaller than the refractive index of said second semiconductor layer, thereby defining a refractive index waveguiding structure transverse to the thickness direction.

* * * * *